(12) United States Patent
Akiba et al.

(10) Patent No.: US 12,148,680 B2
(45) Date of Patent: Nov. 19, 2024

(54) SEMICONDUCTOR DEVICE AND METHOD OF MANUFACTURING THE SAME

(71) Applicant: RENESAS ELECTRONICS CORPORATION, Tokyo (JP)

(72) Inventors: Toshihiko Akiba, Tokyo (JP); Yusuke Tanuma, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 112 days.

(21) Appl. No.: 17/517,908

(22) Filed: Nov. 3, 2021

(65) Prior Publication Data
US 2022/0165638 A1    May 26, 2022

(30) Foreign Application Priority Data

Nov. 20, 2020    (JP) ................................ 2020-193076

(51) Int. Cl.
*H01L 23/367* (2006.01)
*H01L 23/00* (2006.01)
(Continued)

(52) U.S. Cl.
CPC .......... *H01L 23/3675* (2013.01); *H01L 23/04* (2013.01); *H01L 23/10* (2013.01);
(Continued)

(58) Field of Classification Search
CPC ..... H01L 23/3875; H01L 24/32; H01L 24/48; H01L 24/73; H01L 23/373;
(Continued)

(56) References Cited

U.S. PATENT DOCUMENTS

| 7,253,515 B2 | 8/2007 | Horie et al. |
| 2003/0067070 A1 | 4/2003 | Kwon et al. |

(Continued)

FOREIGN PATENT DOCUMENTS

| JP | 2000-192337 A | 7/2000 |
| JP | 2012-054597 A | 3/2012 |

OTHER PUBLICATIONS

Extended European Search Report issued in corresponding European Patent Application No. 21207108.8-1211, dated Apr. 28, 2022.

*Primary Examiner* — Jasmine J Clark
(74) *Attorney, Agent, or Firm* — Rimon P.C.

(57) ABSTRACT

A semiconductor device includes: a wiring substrate; a semiconductor chip mounted on the wiring substrate; a heat release sheet arranged on the semiconductor chip to cover the entire semiconductor chip and having a larger area than an area of the semiconductor chip; and a cover member which covers the semiconductor chip and the heat release sheet and to which the heat release sheet is fixed. The cover member has a first portion facing the semiconductor chip, a flange portion arranged in a periphery of the first portion and bonded and fixed onto the wiring substrate, and a second portion arranged between the first portion and the flange portion. In a plan view of the cover member viewed from the heat release sheet, the heat release sheet is bonded/fixed to the cover member through a bonding member partially arranged between the heat release sheet and the cover member.

11 Claims, 11 Drawing Sheets

(51) Int. Cl.
*H01L 23/04* (2006.01)
*H01L 23/10* (2006.01)

(52) U.S. Cl.
CPC ............. *H01L 24/32* (2013.01); *H01L 24/48* (2013.01); *H01L 24/73* (2013.01); *H01L 24/16* (2013.01); *H01L 2224/16225* (2013.01); *H01L 2224/32225* (2013.01); *H01L 2224/32245* (2013.01); *H01L 2224/48227* (2013.01); *H01L 2224/73265* (2013.01)

(58) Field of Classification Search
CPC ... H01L 23/3736; H01L 23/42; H01L 23/367; H01L 23/49811; H01L 23/49822; H01L 23/49827; H01L 23/5383; H01L 23/5384; H01L 23/3672; H01L 23/49816; H01L 21/50; H01L 2224/73265
USPC ........................................................ 257/712
See application file for complete search history.

(56) References Cited

U.S. PATENT DOCUMENTS

| | | | |
|---|---|---|---|
| 2014/0327138 A1 | 11/2014 | Miyamoto | |
| 2015/0162312 A1* | 6/2015 | Shimizu | H01L 23/3675 |
| | | | 228/199 |
| 2019/0318990 A1* | 10/2019 | Nakagawa | H01L 24/17 |

* cited by examiner

SEMICONDUCTOR DEVICE AND METHOD OF MANUFACTURING THE SAME

CROSS-REFERENCE TO RELATED APPLICATION

The disclosure of Japanese Patent Application No. 2020-193076 filed on Nov. 20, 2020, including the specification, drawings and abstract is incorporated herein by reference in its entirety.

BACKGROUND

The present invention relates to a semiconductor device and a method of manufacturing the same.

There is disclosed a technique listed below.
[Patent Document 1] Japanese Unexamined Patent Application Publication. No. 2012-54597

A semiconductor device having a structure in which a lid is bonded onto a semiconductor chip mounted on a wiring substrate is exemplified (see the Patent Document 1).

SUMMARY

One of issues for achieving sophisticated function of a semiconductor device is to improve heat release performance of the semiconductor device. In attempt to achieve the sophisticated function of the semiconductor device, power consumption increases, which results in increase in an amount of heat generation in the semiconductor chip. If the temperature increase of the semiconductor chip, can be suppressed by improvement of the heat release performance of the semiconductor device, erroneous operation of circuits inside the semiconductor chip due to the heat can be suppressed. Other objects and novel characteristics will be apparent from the description of the present specification and the accompanying drawings.

A semiconductor device according to an embodiment includes: a wiring substrate; a semiconductor chip mounted on the wiring substrate; a heat release sheet arranged on the semiconductor chip to cover the entire semiconductor chip and having a larger area than that of the semiconductor chip; and a cover member which covers the heat release sheet and the semiconductor chip and to which the heat release sheet is fixed. The cover member has a first portion facing the semiconductor chip, a flange portion arranged in a periphery of the first portion and bonded and fixed onto the wiring substrate, and a second portion arranged between the first portion and the flange portion. In a plan view of the cover member viewed from the heat release sheet, the heat release sheet is bonded and fixed to the cover member through a second bonding member partially arranged between the heat release sheet and the cover member.

According to the embodiment, a performance of the semiconductor device can be improved.

BRIEF DESCRIPTIONS OF THE DRAWINGS

DETAILED DESCRIPTION

Figure 1:
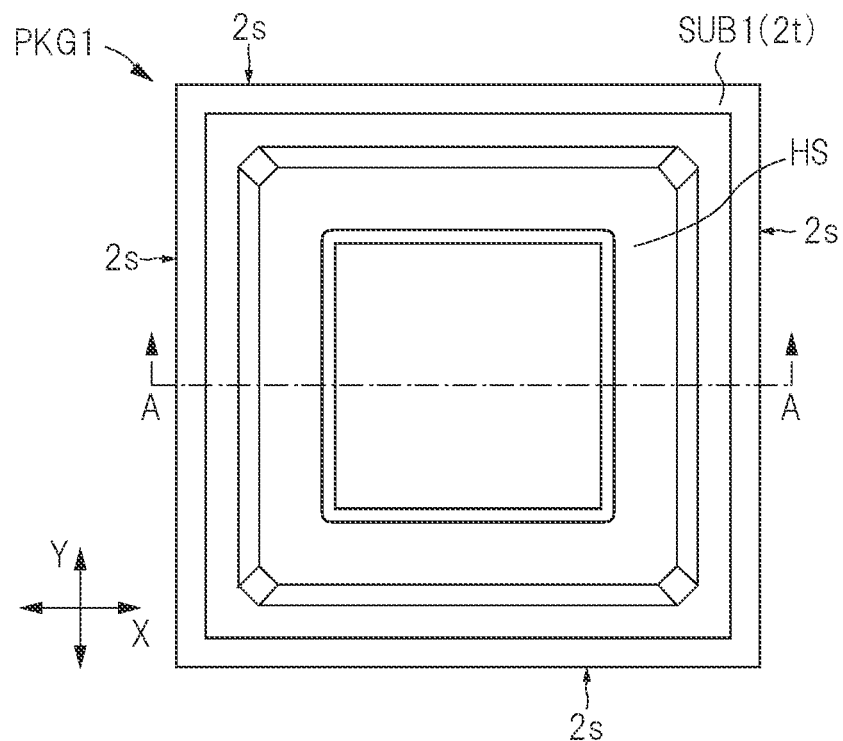
FIG. 1 is a top view of a semiconductor device according to an embodiment.

Explanation of Description Form, Basic Term and Usage in Present Application In the present application, the invention will be described in a plurality of sections or others when required as a matter of convenience. However, these sections or others are not irrelevant to each other unless otherwise stated, and includes modification examples or others in which either one of portions of single example is a specific part, a part or entire of the other unless particularly otherwise stated, regardless of before and after the description. Also, in principle, the repetitive description of the same part is omitted. Further, each element in the embodiments is not indispensable unless otherwise particularly stated not to be so, logically limited to the number, and clearly not to be so from the contexts.

Similarly, when "X made of A" or others is described for materials, compositions, and others in the description of the embodiments or others, the one containing other components than A is not eliminated unless otherwise stated not to be only the component and clearly not to be so from the contexts. For example, the component means "X containing A as a main component" or others. For example, it is needless to say that a "silicon material" or others includes not only pure silicon but also SiGe (silicon germanium) alloy or a multicomponent alloy containing other silicon as a main component, or a member containing other additives or others. Also, gold plating, a Cu layer, nickel plating, and others include not only pure material but also members containing gold, Cu, nickel, and others as a main component, respectively, unless otherwise specified not to be so.

Further, even when a specific numerical value and numerical amount are mentioned, they may exceed the specific numerical values or smaller than the specific numerical values unless otherwise specified not to be so, logically limited to the number, and clearly described to be so from the contents.

Still further, in each drawing of the embodiments, the same or similar parts are denoted with the same or similar symbol or reference number, and the description thereof is not repeated.

Also, in the attached drawings, hatching or others is omitted in some cases even in a cross-sectional view in a conversely complicated case or in a case in which a space is clearly distinguished therefrom. In respect to this, in a case in which it is clear from the description or others, an outline of the background is omitted even in a hole which is closed in a plan view in some cases. Further, hatching or a dot pattern is added to a drawing even when the drawing is not a cross-sectional view in order to explicitly illustrate so as not to be the space or explicitly illustrate a boundary between regions.

In the present specification, a "semiconductor component" is a component using electrons inside a semiconductor. As an example of this "semiconductor component", a semiconductor chip, a semiconductor package in which a semiconductor chip is packaged and others can be exemplified. Regardless of whether the semiconductor is included or not, a component embedded in an electric circuit and having an electric function is referred to as an "electronic component". The electronic components include not only the semiconductor component but also a resistive element, a capacitor element, an inductor element and others.

Semiconductor Device

Figure 2:
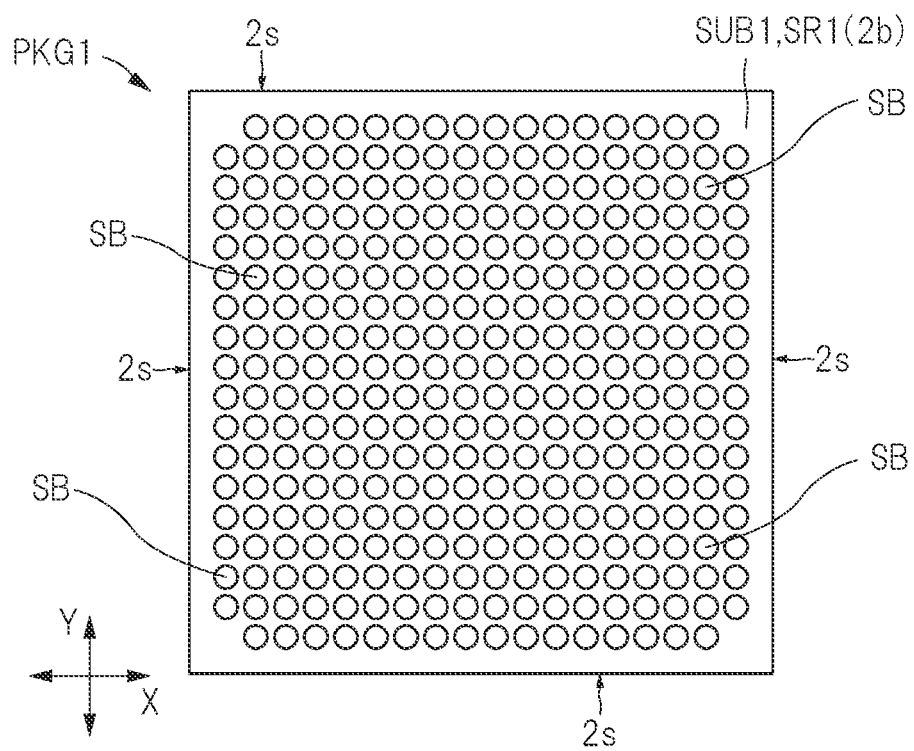
FIG. 2 is a bottom view of the semiconductor device shown in FIG. 1.
Figure 3:
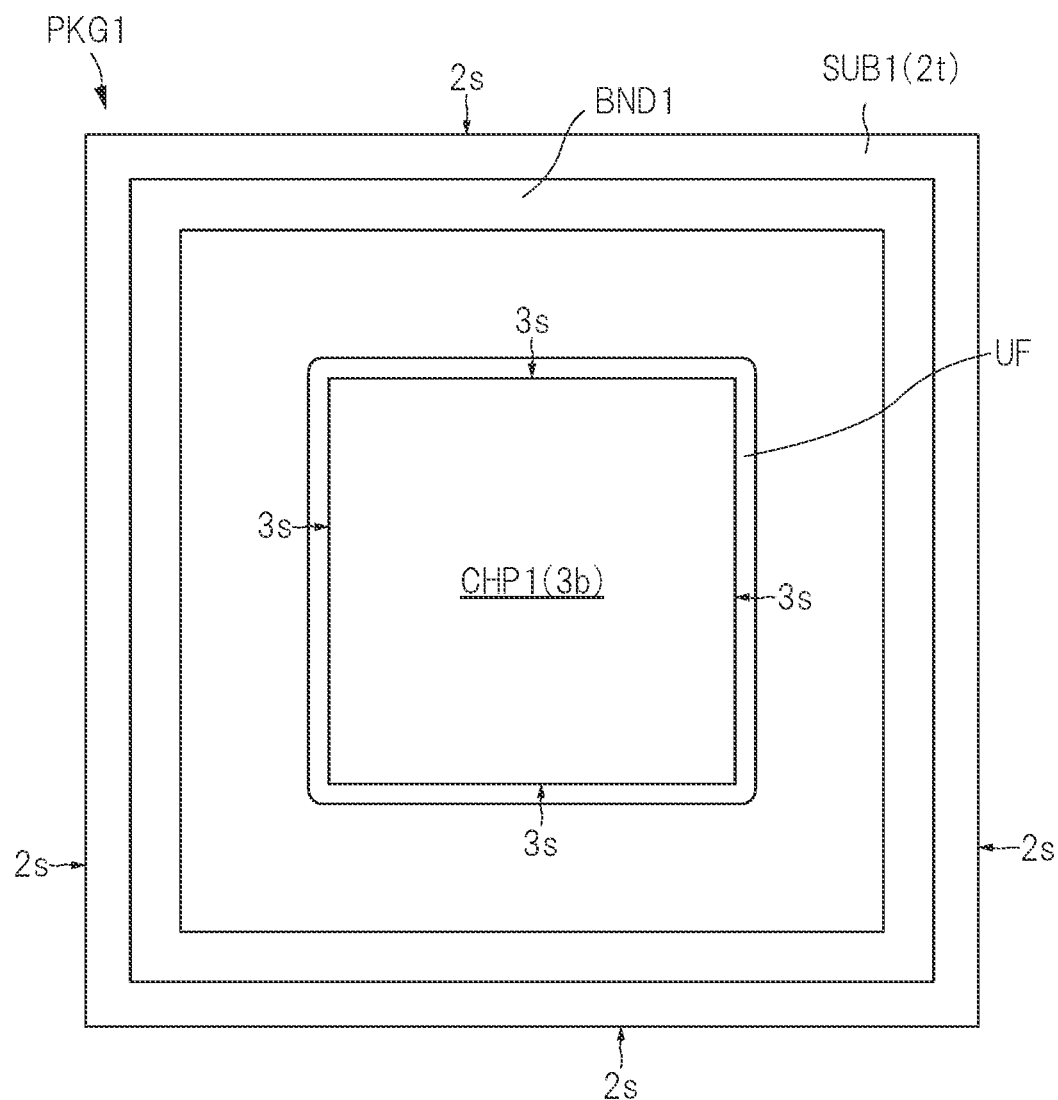
FIG. 3 is a plan view showing an internal structure of the semiconductor device on a wiring substrate in a state in which a cover member shown in FIG. 1 is removed.
Figure 4:
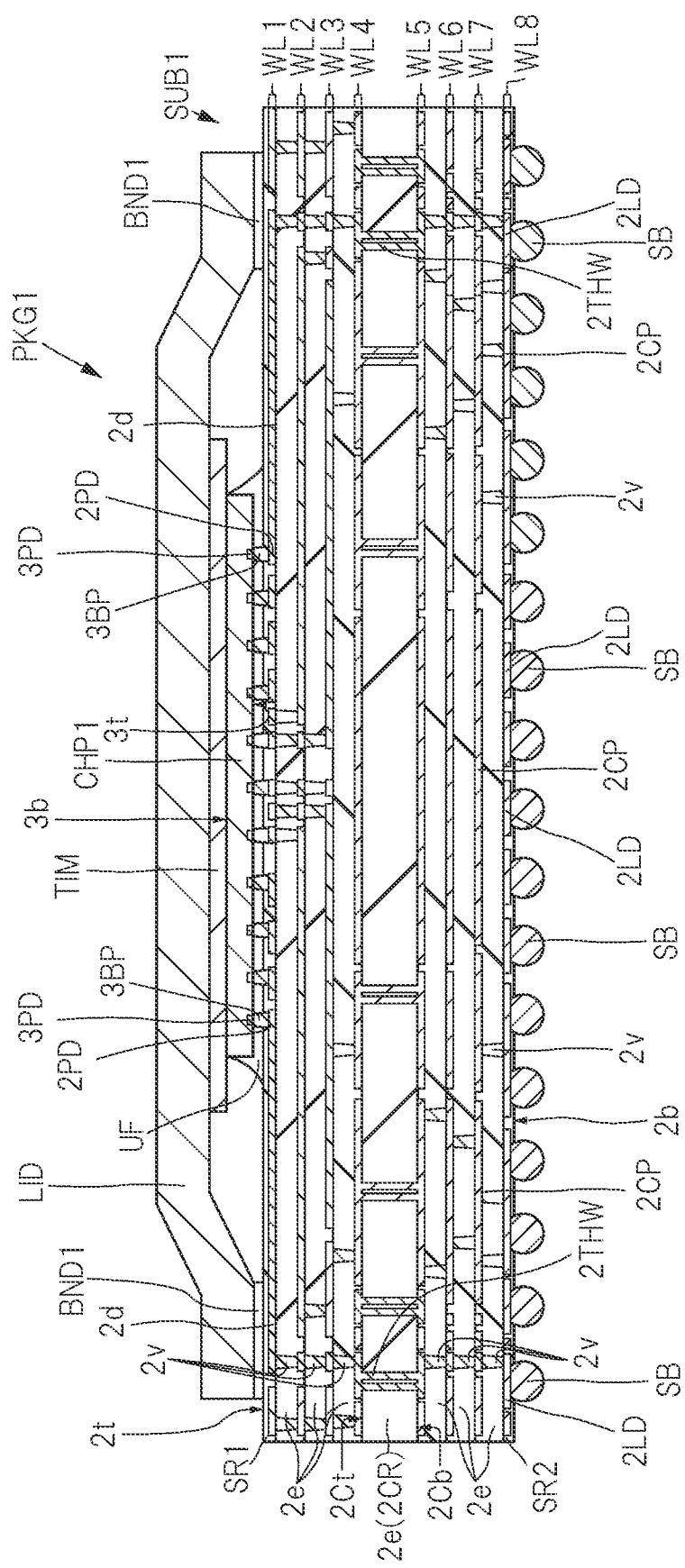
FIG. 4 is a cross-sectional view taken along a line A-A of FIG. 1.

FIG. 1 is a top view of a semiconductor device according to the present embodiment. FIG. 2 is a bottom view of the semiconductor device shown in FIG. 1. FIG. 3 is a plan view showing an internal structure of the semiconductor device on a wiring substrate in a state in which a cover member shown in FIG. 1 is removed. FIG. 4 is a cross-sectional view taken along a line A-A of FIG. 1.

A semiconductor device PKG1 of the present embodiment includes a wiring substrate SUB1, and a semiconductor chip CHP1 (see FIG. 3) mounted on the wiring substrate SUB1. The semiconductor device PKG1 includes: a heat release sheer TIM arranged on the semiconductor chip CHP1; and a cover member LID which covers the entire semiconductor chip CHP1, the entire heat release sheet TIM and a part of the wiring substrate SUB1 and to which the heat release sheet TIM is fixed.

As shown in FIG. 4, the wiring substrate SUB1 has a top surface (surface, main surface, chip mounting surface, first main surface) 2$t$ on which the semiconductor chip CHP1 is mounted and a bottom surface (surface, main surface, packaging surface, second main surface) 2$b$ opposite to the top surface 2$t$. Further, the wiring substrate SUB1 has a plurality of side surfaces 2$s$ (see FIGS. 1 to 3) crossing each outer edge of the top surface 2$t$ and the bottom surface 2$b$. In the present embodiment, each of the top surface 2$t$ (see FIG. 1) and the bottom surface 2$b$ (see FIG. 2) of the wiring substrate SUB1 is rectangular.

The wiring substrate SUB1 includes a plurality of (in an example shown in FIG. 4, eight) wiring layers WL1, WL2, WL3, WL4, WL5, WL6, WL7 and WL8 that electrically connect a terminal (terminal 2PD) close to the top surface 2$t$ that is the chip mounting surface and a terminal (land 2LD) close to the bottom surface 2$b$ that is the packaging surface. Each wiring layer is between the top surface 2$t$ and the bottom surface 2$b$. Each wiring layer includes a conductor pattern such as a wiring that is a passage in which electric signals or power is supplied. And, an insulating film 2$e$ is arranged between the wiring layers. The wiring layers are electrically connected to each other through a via 2$v$ that is an inter-layer electric conductive path penetrating the insulating film 2$e$ or a through hole wiring 2THW. In the present embodiment, note that the wiring substrate including the eight wiring layers is exemplified as the example of the wiring substrate SUB1. However, the number of the wiring layers included in the wiring substrate SUB1 is not limited to eight. For example, a wiring substrate including seven wiring layers or less or nine wiring layers or more can be used as a modification example.

The wiring layer WL1 closest to the top surface 2$t$ among the plurality of wiring layers is covered with the insulating film SR1. The insulating film SR1 has an opening, and the plurality of terminals 2PD arranged in the wiring layer WL1 are exposed at the opening from the insulating film SR1. The wiring layer WL8 closest to the bottom surface 2$b$ of the wiring substrate SUB1 among the plurality of wiring layers has a plurality of lands. The wiring layer WL8 is covered with the insulating film SR2. Each of the insulating film SR1 and the insulating film SR2 is a solder resist film. The plurality of terminals 2PD arranged in the wiring layer WL1 and the plurality of lands 2LD arranged in the wiring layer WL8 are electrically connected to each other through a conductor pattern (the wiring 2$d$ or a large-area conductor pattern), the via 2$v$ and the through hole wiring 2THW formed in each wiring layer included in the wiring substrate SUB1.

The wiring substrate SUB1 is formed by, for example, a build-up method of stacking the plurality of wiring layers on a top surface 2Ct and a bottom surface 2Cb of an insulating layer (core member, core insulating layer) 2CR that is made of a prepreg that is a glass fiber soaked with a resin. The wiring layer WL4 close to the top surface 2Ct of the insulating layer 2CR and the wiring layer WL5 close to the bottom surface 2Cb of the same are electrically connected to each other through the plurality of through hole wirings 2THW embedded in a plurality of through holes penetrating from either one of the top surface 2Ct and the bottom surface 2Cb to the other.

In the example shown in FIG. 4, the wiring substrate SUB1 represents a wiring substrate including the plurality of wiring layers stacked to be close to the top surface 2Ct and the bottom surface 2Cb of the insulating layer 2CR that is the core member. However, so-called coreless substrate may be used as a modification example of FIG. 4, the coreless substrate not including the insulating layer 2CR made of the hard material such as the prepreg and being formed by sequentially stacking the insulating film 2$e$ and the conductor pattern such as the wiring 2$d$. When the coreless substrate is used, the through hole wiring 2THW is not formed, and the wiring layers are electrically connected to each other through the via 2$v$.

In the example shown in FIG. 4, a solder ball (soler member, external terminal, electrode, external electrode) SB is connected to each of the plurality of lands 2LD. The solder ball SB is a conductive member electrically connecting a plurality of terminals (not illustrated) of a motherboard and the plurality of lands 2LD when the semiconductor device PKG1 is mounted on the not-illustrated motherboard. The solder ball SB is, for example, a lead (Pb)-containing Sn—Pb solder member or a solder member made of so-called lead-free solder substantially not containing the Pb. As examples of the lead-free solder, for example, single tin (Sn), tin-bismuth (Sn—Bi), tin-copper-silver (Sn—Cu—

Ag), tin-copper (Sn—Cu) and others are exemplified. In this case, the lead-free solder represents a material containing the lead (Pb) of 0.1 wt % or less, and the content is defined by standards of RoHS (Restriction of Hazardous Substances) order.

As shown in FIG. 2, the plurality of solder balls SB are arranged in a matrix form (array form, matrix shape). Although not illustrated in FIG. 2, the plurality of lands 2LD (see FIG. 4) bonded to the plurality of solder balls SB are also arranged in an array form (matrix from). In this manner, a semiconductor device including the plurality of external terminals (solder balls SB and lands 2LD) arranged in the array form on the region close to the packaging surface of the wiring substrate SUB1 is called an area-array semiconductor device. In the area-array semiconductor device, the region close to the packaging surface (bottom surface 2b) of the wiring substrate SUB1 can be effectively used as an arrangement space for the external terminals. Therefore, the area-array semiconductor device is preferable because increase in a packaging area of the semiconductor device can be suppressed even in increase in the number of the external terminals. In other words, for the achievement of the sophisticated function and the high integration, the semiconductor device having the increased number of the external terminals can be packaged in a space-saving manner.

The semiconductor device PKG1 includes the semiconductor chip CHP1 mounted on the wiring substrate SUB1. As shown in FIG. 4, each semiconductor chip CHP1 has a front surface (main surface, top surface) 3t and a rear surface (main surface, bottom surface) 3b opposite to the front surface 3t. The semiconductor chip CHP1 has a plurality of side surfaces 3s crossing the front surface 3t and the rear surface 3b. The semiconductor chip CHP1 is formed into a rectangular external shape having a smaller plan area than that of the wiring substrate SUB1 in a plan view as shown in FIG. 3. In the example shown in FIG. 3, the semiconductor chip CHP1 is mounted at a center of the top surface 2t of the wiring substrate SUB1, and each of four side surfaces 3s of the semiconductor chip CHP1 extends along each of four sides surfaces 2s of the wiring substrate SUB1.

A plurality of electrodes (pads, electrode pads, bonding pads) 3PD are formed in a region close to the front surface 3t of the semiconductor chip CHP1. In the example shown in FIG. 4, the semiconductor chip CHP1 is mounted on the wiring substrate SUB1 so that the front surface 3t faces the top surface 2t of the wiring substrate SUB1. Such a mounting method is referred to as a face-down packaging method or a flip-chip connection method.

Although not illustrated, a plurality of semiconductor elements (circuit elements) are formed in the main surface of the semiconductor chip CHP1 (more specifically, in a semiconductor-element formation region arranged on an element formation surface of a semiconductor substrate that is a base member of the semiconductor chip CHP1). The plurality of electrodes 3PD are electrically connected to the plurality of semiconductor elements through a wiring (not illustrated) formed in the wiring layer arranged inside the semiconductor chip CHP1 (more specifically, between the front surface 3t and the not-illustrated semiconductor-element formation region).

The semiconductor chip CHP1 (more specifically, the base member of the semiconductor chip CHP1) is made of, for example, silicon (Si). AN insulating film covering the base member of the semiconductor chip CHP1 and the wiring is formed in the front surface 3t, and a part of the plurality of electrodes 3PD is exposed from the insulating film at the opening in the insulating film 3PF. Each of the plurality of electrodes 3PD is made of a metal such as aluminum (Al) in the present embodiment.

As shown in FIG. 4, a protrusion electrode 3BP is connected to each of the plurality of electrodes 3PD, and the plurality of electrodes 3PD of the semiconductor chip CHP1 and the plurality of terminals 2PD of the wiring substrate SUB1 are electrically connected to each other through the plurality of protrusion electrodes 3BP. The protrusion electrode (bump electrode) 3BP is a metal member (conductive member) formed to protrude from the front surface 3t of the semiconductor chip CHP1. The protrusion electrode 3BP is so-called solder bump that is formed by stacking solder members through a foundation metal film (under bump metal). As the solder member configuring the solder bump, a lead-containing solder member or a lead-free solder can be used as similar to the solder ball SB. In the mounting of the semiconductor chip CHP1 on the wiring substrate SUB1, the solder bump is previously formed in both of the plurality of electrodes 3PD and the plurality of terminals 2PD, and a heating process (reflow process) is performed in a state of contact between the solder bumps, so that the solder bumps are unified to form the protrusion electrode 3BP. As a modification example of the present embodiment, a pillar bump (pillar electrode) having a solder film formed in a tip surface of a conductor pillar made of copper (Cu) or nickel (Ni) may be used as the protrusion electrode 3BP.

An underfill resin (insulating resin) UF is arranged between the semiconductor chip CHP1 and the wiring substrate SUB1 as shown in FIG. 4. The underfill resin UF is arranged to close a space between the front surface 3t of the semiconductor chip CHP1 and the top surface 2t of the wiring substrate SUB1. Each of the plurality of protrusion electrodes 3BP is sealed with the underfill resin UF. The underfill resin UF is made of an insulating (non-conductive) material (such as a resin material), and is arranged to seal an electrically-connecting portion between the semiconductor chip CHP1 and the wiring substrate SUB1 (a bonding portion of the plurality of protrusion electrodes 3BP). Since the bonding portion between the plurality of protrusion electrodes 3BP and the plurality of terminals 2PD are covered with the underfill resin UF, a stress on the electrically-connecting portion between the semiconductor chip CHP1 and the wiring substrate SUB1 can be moderated. And, a stress on the bonding portion between the plurality of protrusion electrodes 3BP and the plurality of protrusion electrodes 3BP of the semiconductor chip CHP1 can be also moderated. Further, the main surface where the semiconductor element (circuit element) of the semiconductor chip CHP1 is formed can be protected.

On the rear surface 3b of the semiconductor chip CHP1, a cover member (lid, heat spreader, heat release member) LID is arranged. The cover member LID is, for example, a metal sheet having a higher heat conductivity than that of the wiring substrate SUB1, and has a function of externally discharging the heat generated in the semiconductor chip CHP1. The cover member LID is thermally connected to the semiconductor chip CHP1 through the heat release sheet TIM. The heat release sheet TIM is in contact to each of the semiconductor chip CHP1 and the cover member LID.

As a method of thermally connecting the semiconductor chip CHP1 and the cover member LID, a method of using an electric-conductive paste that is formed by mixture of metallic fillers such as silver particles into a resin paste is exemplified. For example, an electric-conductive paste such as a silver paste that is formed by mixture of a lot of silver fillers into an epoxy resin is exemplified. However, in the case of the electric-conductive paste, the heat is transmitted through the metallic particles dispersed in the resin material, and therefore, improvement of the efficiency of the heat conductivity is limited. Accordingly, a method of arranging the heat release sheet TIM made of a material that is selected in order to provide the high heat conductivity between the semiconductor chip CHP1 and the cover member LID is effective in a point of view of the improvement of the efficiency of the heat conductivity.

The heat release sheet TIM is a heat release member for thermally connecting the semiconductor chip CHP1 and the cover member LID. A shape of the heat release sheet TIM is formed into, for example, a sheet shape so as to be easy to be arranged between the semiconductor chip CHP1 and the cover member LID. In a point of view of improvement of the heat release property from the semiconductor chip CHP1 to the cover member LID, the heat release sheet TIM needs to have the high heat release property. A heat conductivity of a material making up the heat release sheet TIM is higher than at least a heat conductivity of a material making up the underfill resin UF. The heat conductivity of the material making up the heat release sheet TIM is preferably higher than a heat conductivity of a material making up the cover member LID. As an example of the material capable of improving the heat conductivity of the heat release sheet, for example, a metallic film such as a copper film or a silver film can be exemplified. As another example, a carbon graphite or a boron nitride can be exemplified. The case of the usage of the carbon graphite can particularly provide the heat release sheet TIM having the heat conductivity that is about several times higher than that of the metallic material such as copper or silver. Details of the cover member LID and the heat release sheet TIM will be described later.

Heat Release Passage

Figure 5:
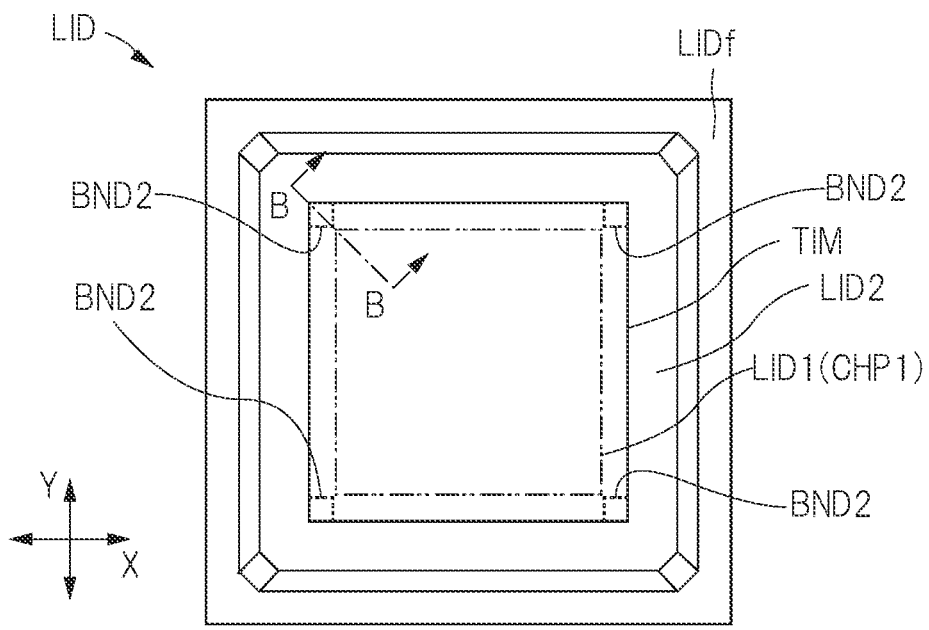
FIG. 5 is a plan view of the cover member shown in FIG. 4 viewed from the heat release sheet.
Figure 6:
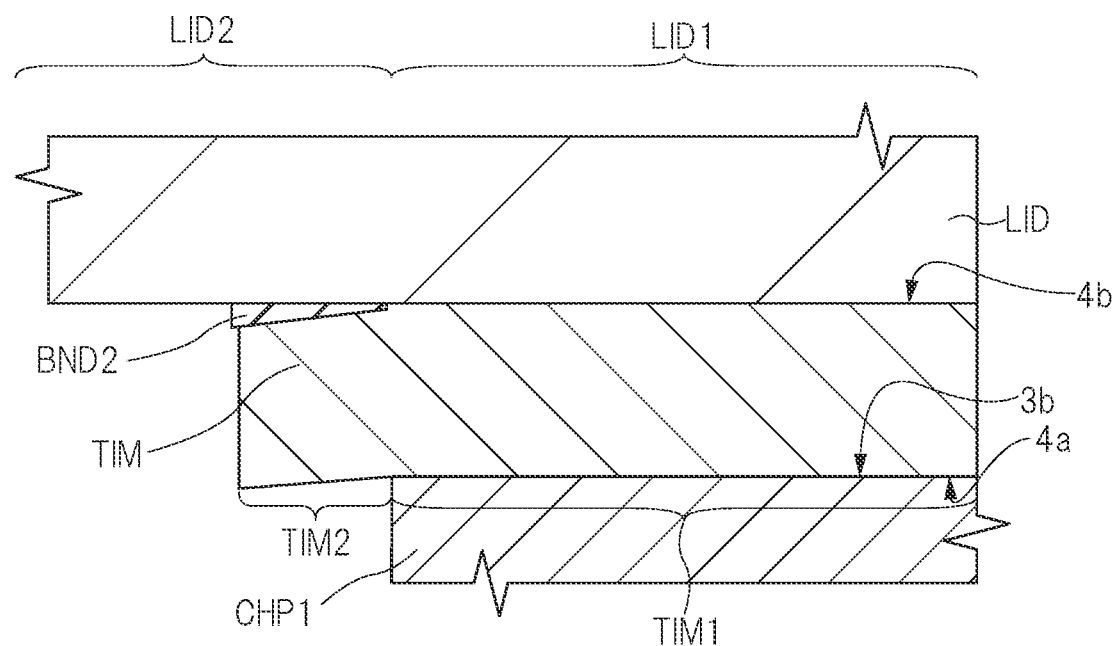
FIG. 6 is an enlarged cross-sectional view taken along a line B-B of FIG. 5.
Figure 7:
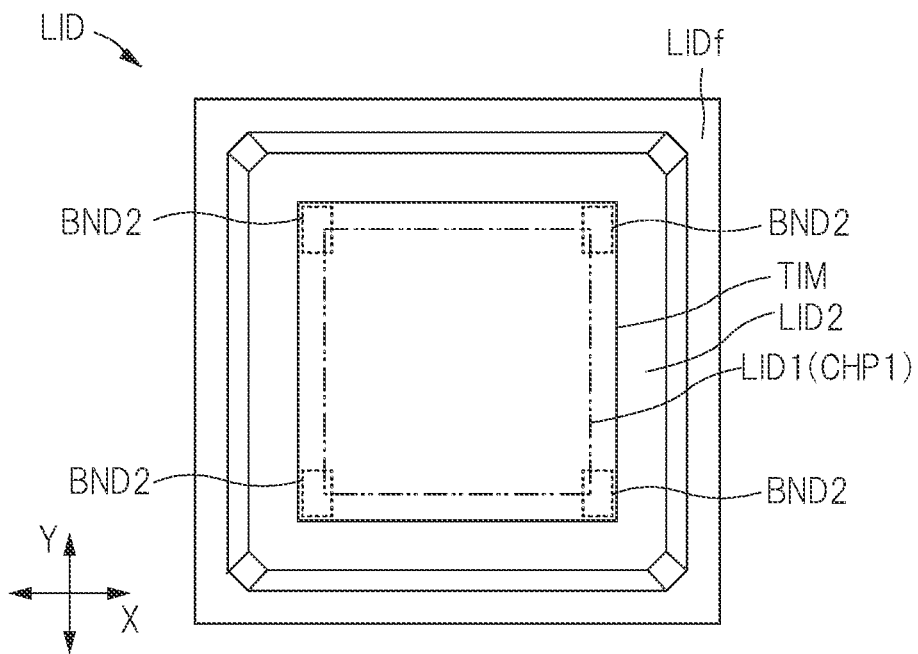
FIG. 7 is a plan view showing an example of layout of a bonding member according to a modification example of FIG. 5.

Next, the details of the cover member LID and the heat release sheet TIM shown in FIG. 4 will be explained. FIG. 5 is a plan view of the cover member shown in FIG. 4 viewed from the heat release sheet. FIG. 6 is an enlarged cross-sectional view taken along a line B-B of FIG. 5. FIG. 7 is a plan view showing an example of a layout of a bonding member according to a modification example of FIG. 5. In FIGS. 5 and 7, an outline of a portion LID1 facing the semiconductor chip CHP1 is shown with a dashed double-dotted line. In FIGS. 5 and 7, an outline of a plurality of bonding members BND2 arranged between the cover member LID and the heat release sheet TIM is shown with a dotted line. In the following explanation, in each drawing shown as the modification example of FIG. 5, the outline of the portion LID1 is shown with the dashed double-dotted line, and a portion of the bonding member BND2 arranged between the cover member LID and the heat release sheet TIM is shown with the dotted line.

As shown in FIG. 5, the cover member LID has the portion LID1 facing the rear surface 3b (see FIG. 4) of the semiconductor chip CHP1 (see FIG. 4), a flange portion LIDf arranged in a periphery of the portion LID1 and bonded and fixed onto the top surface 2t of the wiring substrate SUB1 through the bonding member BND1 (see FIG. 4), and a portion LID2 arranged between the portion LID1 and the flange portion LIDf. In a plan view of the cover member LID viewed from the heat release sheet TIM as shown in FIG. 5, the heat release sheet TIM is bonded and fixed to the cover member LID through a bonding member BND2 partially arranged between the heat release sheet TIM and the cover member LID.

When the cover member LID is used as a main passage for releasing the heat generated in the semiconductor chip CHP1, it is important to improve the heat release property of the heat release passage that thermally connects the semiconductor chip CHP1 and the cover member LID shown in FIG. 6. For example, if there is a space between the semiconductor chip CHP1 and the heat release sheet TIM or a space between the cover member LID and the heat release sheet TIM, the heat release property is reduced because of the existence of the space.

If the heat release sheet TIM is fixed to the semiconductor chip CHP1, it is necessary to arrange a bonding member such as a resin between the semiconductor chip CHP1 and the heat release sheet TIM. When a resin bonding member such as an epoxy resin is used as the bonding member, a heat conductivity of a portion of the resin bonding member is low, and therefore, increase in an application amount of the resin bonding member decreases the heat conductivity of the heat release passage. A method of using the electric-conductive paste that is formed by the mixture of the metallic particles such as the silver fillers into the resin paste for the bonding member is considerable. However, in the case of the electric-conductive paste, the heat is transmitted through the metallic particles dispersed in the resin material, and therefore, the electric-conductive paste has a lower heat conductivity than that of a heat release member such as the heat release sheet TIM of the present embodiment made of a material that is selected in order to provide the high heat conductivity.

In the present embodiment, since the heat release sheet TIM is fixed to the cover member LID by the bonding member BND2, it is unnecessary to interpose the bonding member between the heat release sheet TIM and the semiconductor chip CHP1. Therefore, when the cover member LID previously bonded and fixed to the heat release sheet TIM is pressed onto the wiring substrate SUB1 (see FIG. 4) through the bonding member BND1 (see FIG. 4), the rear surface 3b of the semiconductor chip CHP1 and the heat release sheet TIM can be made easy to be in contact with each other. When the bonding member BND1 is hardened in the state of the contact between the semiconductor chip CHP1 and the heat release sheet TIM, voids are difficult to remain between the semiconductor chip CHP1 and the heat release sheet TIM. This results in the high heat release property at the connection interface between the semiconductor chip CHP1 and the heat release sheet TIM.

As shown in FIG. 6, the heat release sheet TIM covers the entire rear surface 3b of the semiconductor chip CHP1. The heat release sheet TIM has a portion TIM1 overlapping the rear surface 3b of the semiconductor chip CHP1 and a portion TIM2 not overlapping the rear surface 3b. In other words, the heat release sheet TIM has a surface 4a facing the semiconductor chip CHP1 and a surface 4b opposite to the surface 4a, and each area of the surfaces 4a and 4b is larger than an area of the rear surface 3b of the semiconductor chip CHP1. When the area of the heat release sheet TIM is larger than the area of the rear surface 3b of the semiconductor chip CHP1, the same area as the area of the semiconductor chip CHP1 can be secured as the heat release area even if positional difference is caused at the time of the fixation of the heat release sheet TIM or at the time of the attachment of the cover member LID. Since the bonding member BND2 is partially arranged between the heat release sheet TIM and the cover member LID, the heat release sheet TIM and the cover member LID can be made in contact with each other at a portion where the bonding member BND2 is not arranged. This results in the high heat release property at the connection interface between the cover member LID and the heat release sheet TIM.

In this manner, according to the present embodiment, the high heat release property can be secured at each of the connection interface between the semiconductor chip CHP1 and the heat release sheet TIM and the connection interface between the cover member LID and the heat release sheet TIM, and therefore, the heat generated in the semiconductor chip CHP1 can be effectively discharged. This results in the suppression of the increase in the temperature of the semiconductor chip CHP1, and therefore, can suppress the erroneous operation due to the heat of the circuit inside the semiconductor chip CHP1. In other words, according to the present embodiment, the sophisticated function of the semiconductor chip CHP1 can be achieved, and the performance of the same can be improved.

As shown in FIG. 6, the heat release sheet TIM is bonded and fixed to the cover member LID through the bonding member BND2 arranged at the position overlapping the portion LID2 of the cover member LID. In other words, in a thickness direction of the heat release sheet TIM, the heat release sheet TIM has a portion TIM1 overlapping the semiconductor chip CHP1 and a portion TIM2 not overlapping the semiconductor chip CHP1 but overlapping the portion LID2 of the cover member LID. The bonding member BND2 that bonds the heat release sheet TIM and the cover member LID is bonded to the portion TIM2 of the heat release sheet TIM. Although not illustrated, a case of bonding of the bonding member BND2 to not the portion TIM2 but the portion TIM1 also exemplified as a modification example of the present embodiment. Even in this case, when the bonding member BND2 is partially bonded, the heat release passage can be secured through the portion not bonded to the bonding member BND2.

On the other hand, when the bonding member BND2 is arranged at the position overlapping the portion LID2 (the position overlapping the portion TIM2) as shown in FIG. 6, necessary bonding strength can be secured even if an amount of the bonding member BND2 arranged at the position overlapping the portion LID1 is small. Ideally, the bonding member BND2 is particularly preferable not to be arranged at the position overlapping the portion LID1 of the cover member LID (in other words, not to be arranged in the portion TIM1 of the heat release sheet TIM). In order to improve the heat release efficiency, a distance of the heat release passage is better to be small. In a case of a heat release passage from the semiconductor chip CHP1 to the cover member LID shown in FIG. 6, a passage from the rear surface 3b of the semiconductor chip CHP1 to the portion LID1 of the cover member LID has the smallest distance. Therefore, by arranging the bonding member BND2 having the lower heat conductivity than that of the heat release sheet not to be in the connectable heat release passage having the smallest distance, the heat release efficiency of the entire semiconductor device PKG1 (see FIG. 4) can be improved.

Even if a part of the bonding member BND2 is arranged in the region overlapping the portion LID1 as shown in the modification example of FIG. 7, the heat release efficiency does not immediately significantly decrease. However, in a point of view of the improvement of the heat release efficiency, the area of the bonding member BND2 arranged at the position overlapping the portion LID1 of the cover member LID is preferably small. For example, in the example shown in FIG. 7, in comparison in the area of the region where the bonding member BND2 is arranged, the bonding area of the bonding member BND2 arranged in the region overlapping the portion LID2 is larger than the bonding area of the bonding member BND2 arranged in the region overlapping the portion LID1. This case can reduce the degree of the decrease in the heat release efficiency due to the arrangement of the bonding member BND2 in the region overlapping the portion LID1. Although not illustrated, in another example of FIG. 7, in the comparison in the area of the region where the bonding member BND2 is arranged, the bonding area of the bonding member BND2 arranged in the region overlapping the portion LID2 may be smaller than the bonding area of the bonding member BND2 arranged in the region overlapping the portion LID1.

Figure 8:
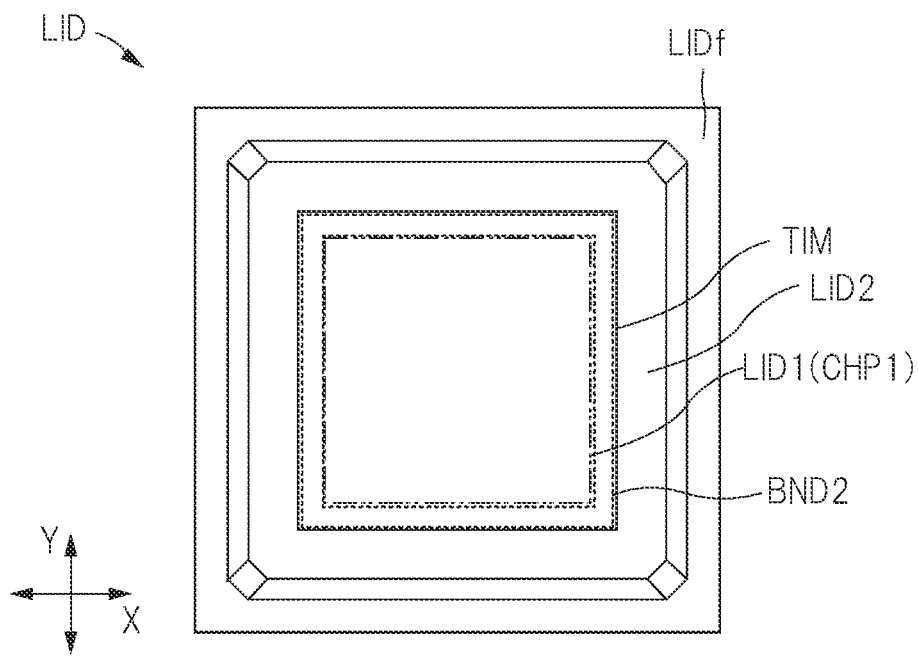
FIG. 8 is a plan view showing an example of layout of a bonding member according to another modification example of FIG. 5.

FIG. 8 is a plan view showing an example of a layout of a bonding member according to another modification example of FIG. 5. As shown in FIG. 8, in the modification example of FIG. 5, a frame-shaped bonding member BND2 may be arranged to surround the periphery of the portion LID1 of the cover member LID. In the example shown in FIG. 8, the bonding member BND2 Ls arranged at the position overlapping the portion LID2 of the cover member LID but nor arranged at the position overlapping the portion LID1.

On the other hand, in the example shown in FIG. 5, the heat release sheet TIM is bonded and fixed to the cover member LID through the plurality of bonding members BND2 that separate from one another. Although described in detail later, in a step of bonding and fixing the heat release sheet TIM to the cover member LID, the heat release sheet TIM is bonded and fixed thereto by attaching the heat release sheet TIM to the cover member LID in a state in which the bonding members BND2 are applied to at least either one of the heat release sheet TIM and the cover member LID, and then, hardening the bonding members BND2. In this case, when gas remains in a space surrounded by the bonding members BND2, the heat release sheet TIM and the cover member LID, there is no passage for discharging this gas, the gas possibly remains between the heat release sheet TIM and the cover member LID. Therefore, in the example shown in FIG. 8, the work for attaching the heat release sheet TIM to the cover member LID is preferably performed under a vacuum state (that is a depressurized state having a lower pressure than atmospheric pressure). Meanwhile, in the example shown in FIG. 5, since there is the space between the plurality of bonding members BND2, the gas is discharged outside by pressing of the heat release sheet TIM onto the cover member LID. Alternatively, even if the gas remains between the heat release sheet TIM and the cover member LID, the remaining gas can be discharged through a gap between the heat release sheet TIM and the cover member LID by pressing of the cover member LID in a direction toward the rear surface 3b of the semiconductor chip CHP1 in the step of bonding and fixing the cover member LID to the wiring substrate SUB1 (see FIG. 4).

First Modification Example

Figure 9:
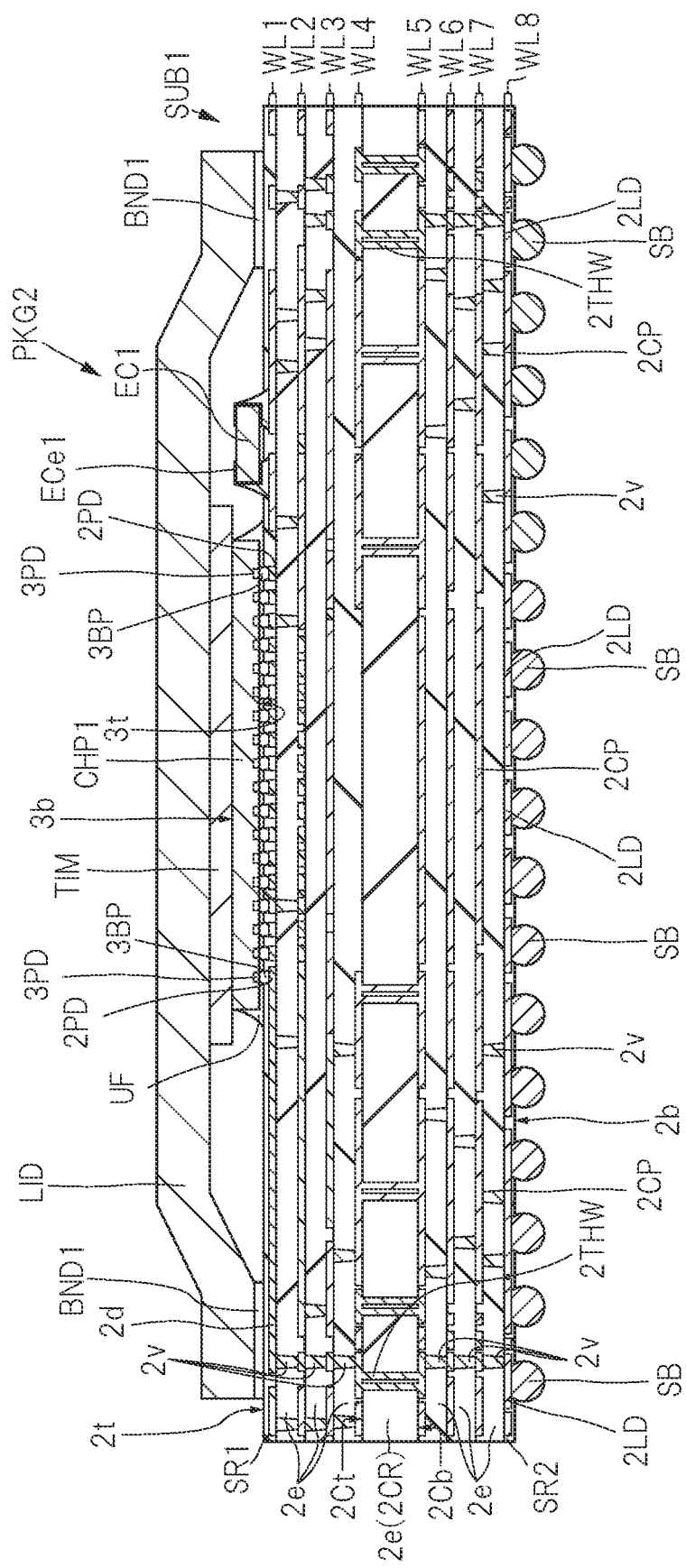
FIG. 9 is a cross-sectional view of a semiconductor device according to a modification example of FIG. 4.
Figure 10:
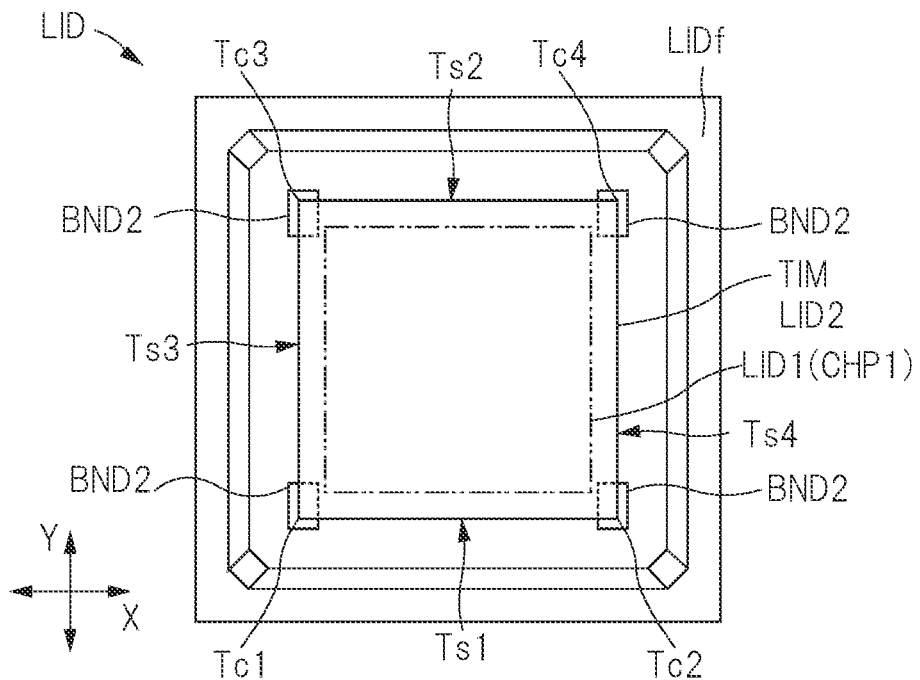
FIG. 10 is a plan view of a cover member shown in FIG. 9 viewed from a heat release sheet according to another modification example of FIG. 5.

Next, as a modification example of the semiconductor device shown in FIGS. 1 to 4, an embodiment in a case of arrangement of an electronic component, other than the semiconductor chip, between the cover member LID and the wiring substrate SUB1 will be explained. FIG. 9 is a cross-sectional view of a semiconductor device according to a modification example of FIG. 4. FIG. 10 is a plan view of a cover member shown in FIG. 9 viewed from a heat release sheet according to another modification example of FIG. 5.

A semiconductor device PKG2 shown in FIG. 9 is different from the semiconductor device PKG1 shown in FIG.

4 in that an electronic component EC1 is arranged in a space surrounded by the cover member LID and the wiring substrate SUB1. The electronic component EC1 is, for example, a capacitor that is electrically connected to a power-supply circuit included in the semiconductor chip CHP1. Since the electronic component EC1 that is the capacitor is arranged in vicinity of the semiconductor chip CHP1, voltage drop at the time of instantaneous increase in power demand in some circuits of the semiconductor chip CHP1 can be suppressed. The electronic component EC1 that is the capacitor is applicable as a bypass capacitor or a decoupling capacitor. Note that one example has been described as the type of the electronic component EC1, but not only the capacitors but also various modification examples such as a resistive element, an inductor or a semiconductor component are exemplified.

As shown in FIG. 9, the semiconductor device PKG2 includes the electronic component EC1 that is mounted on the wiring substrate SUB1 and that is covered with the cover member LID. The electronic component EC1 includes an electrode ECe1 exposed to a space surrounded by the cover member LID and the wiring substrate SUB1. As shown in the drawing, when the exposed electrode ECe1 on the wiring substrate SUB1 is arranged next to the semiconductor chip CHP1, it is necessary to pay attention to an electric trouble of a falling piece resulted from breakage of the heat release sheet TIM. In other words, when the heat release sheet TIM is the member having the electric conductivity, the piece resulted from the breakage of a part of the heat release sheet TIM becomes an electric-conductive substance. This electric-conductive substance may become a cause of the electric trouble such as short circuit when being in contact with the electrode ECe1. However, as described above, the heat release sheet TIM is the member for improving the heat conductive property, and a lot of materials for this have the electric conductivities in many cases. For example, carbon graphite has higher heat conductivity than those of copper and silver, but has the electric conductivity at the same time. Therefore, when the electronic component EC1 including the exposed electrode ECe1 is arranged next to the semiconductor chip CHP1, it is important to suppress the breakage of the heat release sheet TIM.

According to the study of the present inventors, when the planar shape of the heat release sheet TIM is rectangular, the easily-broken portions are particularly four corners. If the bonding member BND2 is bonded to the four corners, the breakage of the heat release sheet TIM can be prevented. In explanation with reference to FIG. 10, the heat release sheet TIM has four sides and four corners that are cross points between the four sides in plan view. Specifically, the heat release sheet TIM has a side Ts1 extending in an X direction, a side Ts2 opposite to the side Ts1, a side Ts3 extending in a Y direction crossing the X direction and a side Ts4 opposite to the side Ts3. Further, the heat release sheet TIM has a corner Tc1 positioned at a cross point between the side Ts1 and the side Ts3, a corner Tc2 positioned at a cross point between the side Ts1 and the side Ts4, a corner Tc3 positioned at a cross point between the side Ts2 and the side Ts3 and a corner Tc4 positioned at a cross point between the side Ts2 and the side Ts4. In this case, as shown in FIG. 10, the bonding member BND2 is bonded to each of the four corners (specifically, the corners Tc1, Tc2, Tc3 and Tc4) of the heat release sheet.

The stress is easy to concentrate on the corners Tc1, Tc2, Tc3 and Tc4. Therefore, if the heat release sheet TIM is broken, any of the corners Tc1, Tc2, Tc3 and Tc4 is easy to be broken. When the bonding member BND2 is bonded to each of the four corners Tc1, Tc2, Tc3 and Tc4 as shown in FIG. 10, the bonding member BND2 can prevent the falling out resulted from the breakage of the heat release sheet TIM.

In a method of suppressing the breakage of the heat release sheet TIM, "R (round) chamfering" process may be performed to each of the corner Tc1, Tc2, Tc3 and Tc4 to previously cut each cross point of the sides Ts1, Ts2, Ts3 and Tc4. In this case, the R-chamfered portions can be regarded as the corners Tc1, Tc2, Tc3 and Tc4.

Figure 11:
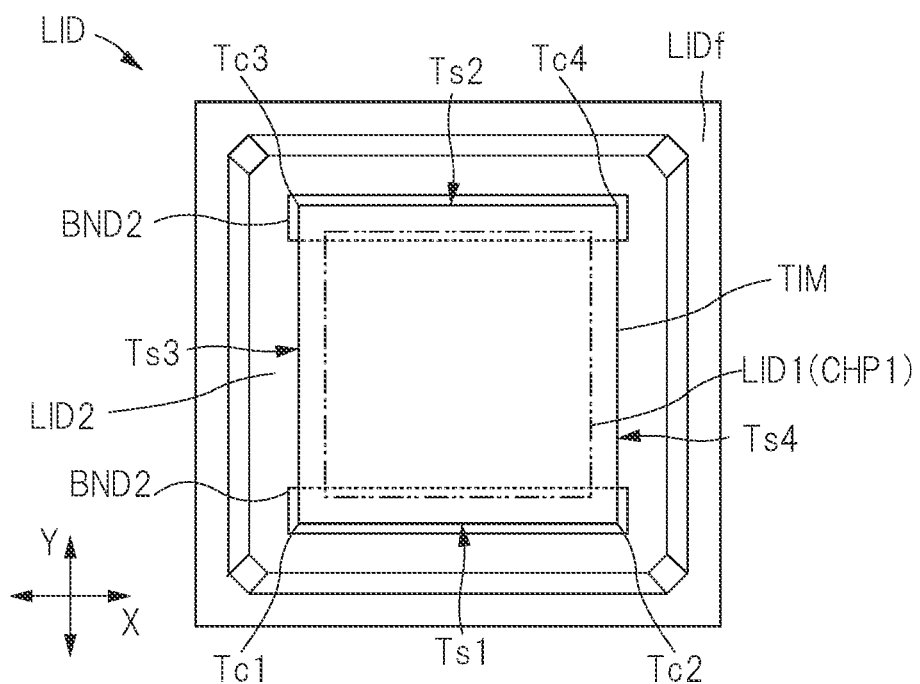
FIG. 11 is a plan view showing an example of layout of a bonding member according to a modification example of FIG. 10.

FIG. 10 shows the example of the bonding of the bonding members BND2 that separate from one another onto each of the corners Tc1, Tc2, Tc3 and Tc4. However, a layout of the bonding members BND2 includes various modification examples. For example, as shown in FIG. 11 that is one modification example of FIG. 10, a bonding member BND2 that extends in a belt shape is used in some cases. In an example shown in FIG. 11, the bonding member BND2 that extends in the belt shape along the side Ts1 is bonded to the corner Tc1 and the corner Tc2. The bonding member BND2 that extends in the belt shape along the side Ts2 is bonded to the corner Tc3 and the corner Tc4.

Figure 12:
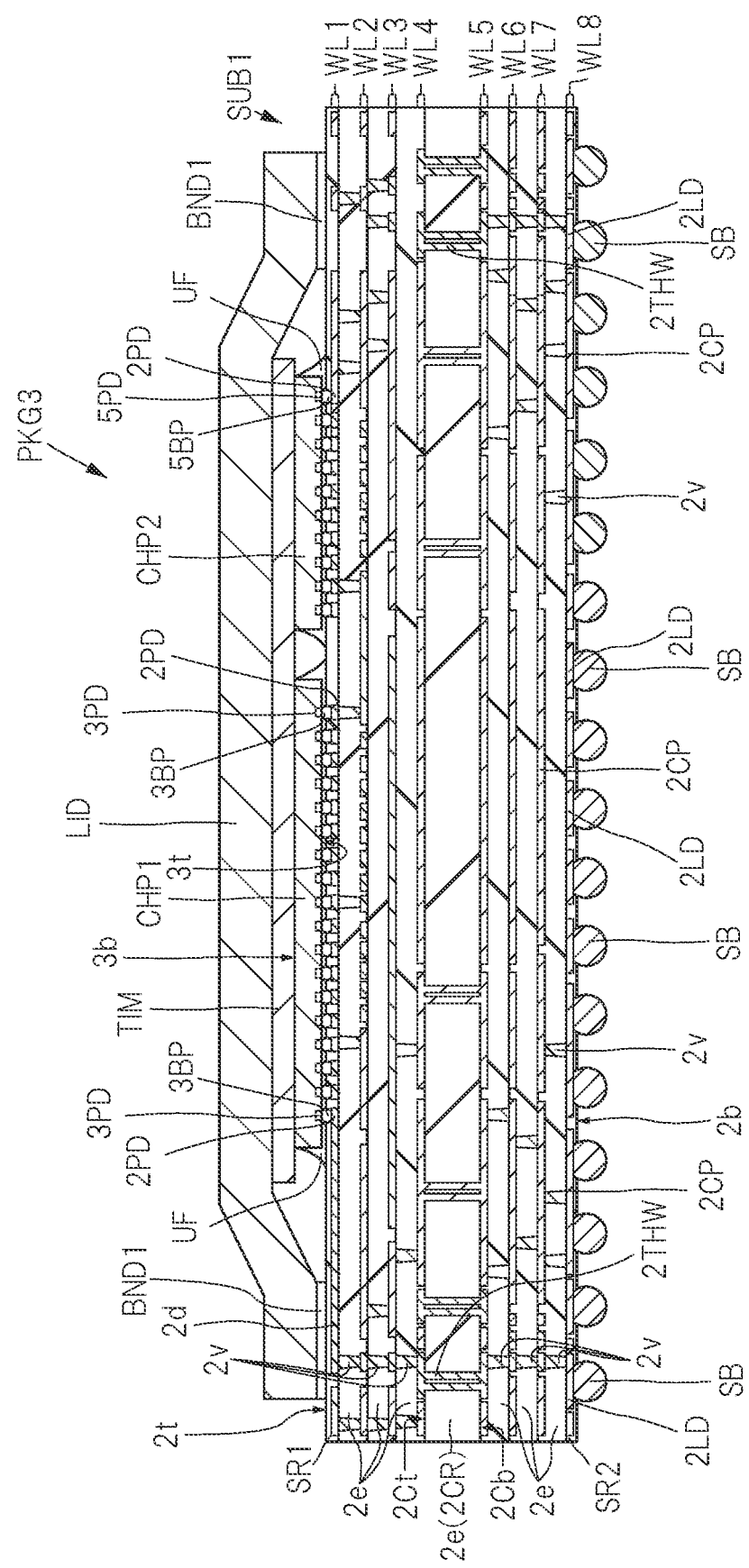
FIG. 12 is a cross-sectional view showing a modification example of FIG. 9.

FIG. 12 is a cross-sectional view showing a modification example of FIG. 9. A semiconductor device PKG2 shown in FIG. 12 is different from the semiconductor device PKG1 shown in FIG. 9 in that a semiconductor component CHP2 is mounted in a space surrounded by the cover member LID and the wiring substrate SUB1. The semiconductor component CHP2 is mounted on a wiring substrate SUB1 so that the surface having the plurality of electrodes 5PD formed thereon faces the top surface 2t of the wiring substrate SUB1. The plurality of electrodes 5PD of the wiring substrate SUB1 and the plurality of terminals 2PD of the wiring substrate are electrically connected to each other through a protrusion electrode 5BP. Each of the plurality of electrodes 5PD and the protrusion electrode 5BP is sealed by the underfill resin UF.

The semiconductor component CHP2 is, for example, a memory package including a memory circuit. Meanwhile, the semiconductor chip CHP1 in the example shown in FIG. 12 includes, for example, a control circuit for transmitting data signals to/from the memory circuit of the semiconductor component CHP2.

In the case of the semiconductor device including the plurality of semiconductor components (the semiconductor chip CHP1 and the semiconductor component CHP2) as seen in the semiconductor device PKG3, the contact of the heat release sheet TIM to each of the plurality of semiconductor components can cause the plurality of semiconductor components to be arranged close to each other, and can contribute to the reduction in the number of processes for the attachment of the heat release sheet TIM. As shown in FIG. 12, the heat release sheet TIM is arranged to cover each of the semiconductor chip CHP1 and the semiconductor component CHP2. The heat release sheet TIM is bonded and fixed to the cover member LID as similar to the semiconductor device PKG1 shown in FIG. 4 and the semiconductor device PKG2 shown in FIG. 9. The layout of the bonding member BND2 (see FIG. 5) is the same as the layout of the bonding member BND2 explained with reference to FIGS. 5 to 8, 10 and 11. In either way, since the semiconductor component CHP2 and the heat release sheet TIM can be in contact with each other, the efficiency of the heat conductivity of the heat release passage from the semiconductor component CHP2 can be improved.

Second Modification Example

Figure 13:
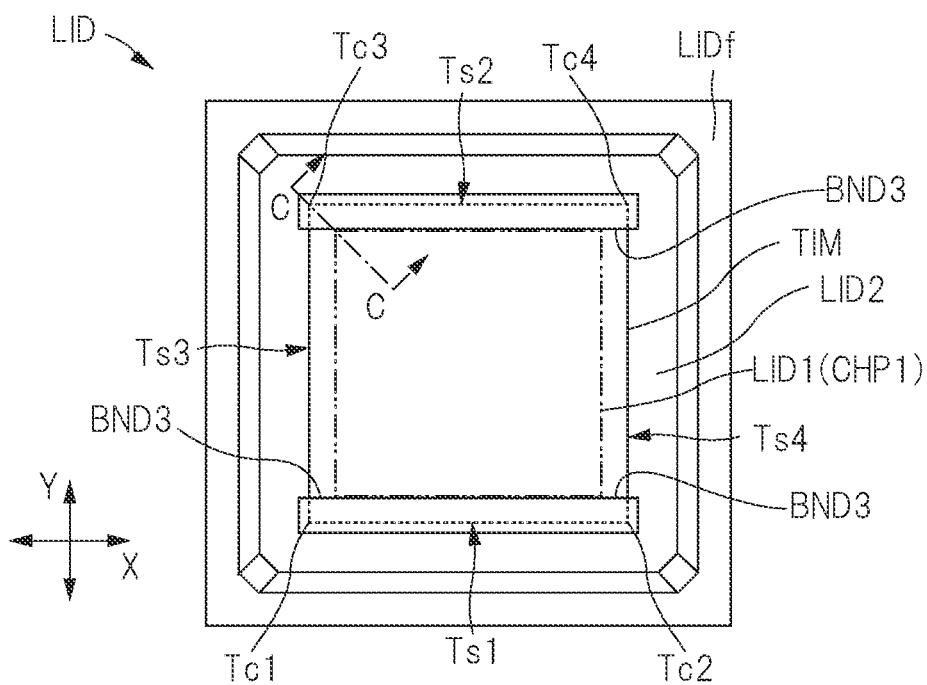
FIG. 13 is a plan view showing a modification example of FIG. 11.
Figure 14:
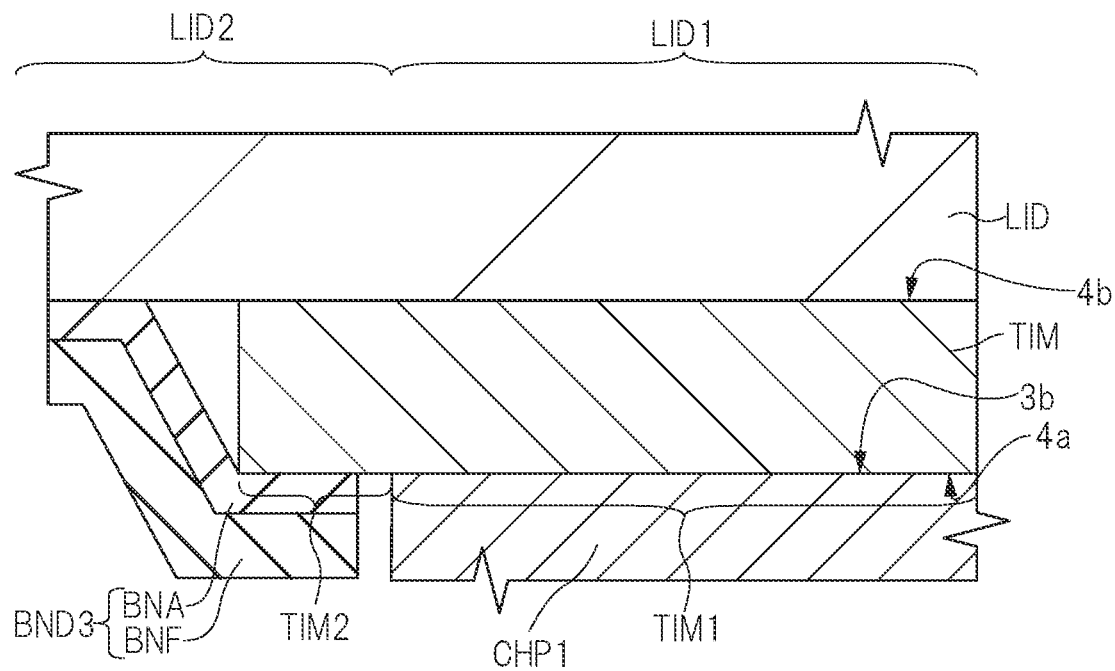
FIG. 14 is an enlarged cross-sectional view taken along a line C-C of FIG. 13.

Next, as a modification example of FIG. 11, a modification example of a method of bonding and fixing a bonding member will be explained. FIG. 13 is a plan view showing a modification example of FIG. 11. FIG. 14 is an enlarged cross-sectional view taken along a line C-C of FIG. 13. In FIG. 13, since a part of the heat release sheet TIM is covered with a bonding member BND3, an outline of the heat release sheet TIM is illustrated with a dotted line.

A method of arranging the bonding member BND3 shown in FIGS. 13 and 14 is different from the method of bonding and fixing the heat release sheet TIM shown in FIG. 11 in that the bonding member BND3 is attached to a region close to a surface 4a (see FIG. 14) of the heat release sheet TIM, the surface facing the semiconductor chip CHP1. As shown in FIG. 14, the heat release sheet TIM has the surface 4a facing the semiconductor chip CHP1 and a surface 4b opposite to the surface 4a. The bonding member BND3 is a tape member including a film layer BNF and a sticking layer BNA formed on either one surface of the film layer BNF. The sticking layer BNA of the bonding member BND3 is pasted on the surface 4a of the heat release sheet TIM and the cover member LID.

In the present modification example, the bonding member BND3 does not intervene between the semiconductor chip CHP1 and the heat release sheet TIM and between the heat release sheet TIM and the cover member LID. Therefore, a contact area between the heat release sheet TIM and the cover member LID can be made larger than that of the embodiment shown in FIG. 6.

In the present modification example, since an end of the heat release sheet TIM is covered with the bonding member BND3 that is the tape member, it is easy to prevent the falling out resulted from the partial breakage of the heat release sheet TIM.

In the present modification example, the layout illustrated in FIG. 13 is shown as the example of embodiments in which the bonding member BND3 is attached to the surface 4a of the heat release sheet TIM. However, a shape and a layout of the bonding member BND3 include various modification examples. For example, as similar to the bonding member BND2 shown in FIG. 5, four bonding members BND3 that separate from one another may be attached to the corners Tc1, Tc2, Tc3 and Tc4 (see FIG. 13) of the heat release sheet TIM, respectively. Alternatively, as similar to the bonding member BND2 shown in FIG. 8, a frame-shaped bonding member BND3 may be attached to surround the periphery of the portion LID1 of the cover member LID.

However, in the present modification example, it is preferable to arrange the bonding member BND3 not to be at a position overlapping the portion LID1 of the cover member LID in a point of view of avoidance of interference from the semiconductor chip CHP1 as shown in FIG. 14. And, in order to fix the heat release sheet TIM to the cover member LID, it is necessary to bond the sticking layer BNA of the bonding member BND3 to the heat release sheet TIM and the cover member LID.

Method of Manufacturing Semiconductor Device

Figure 15:
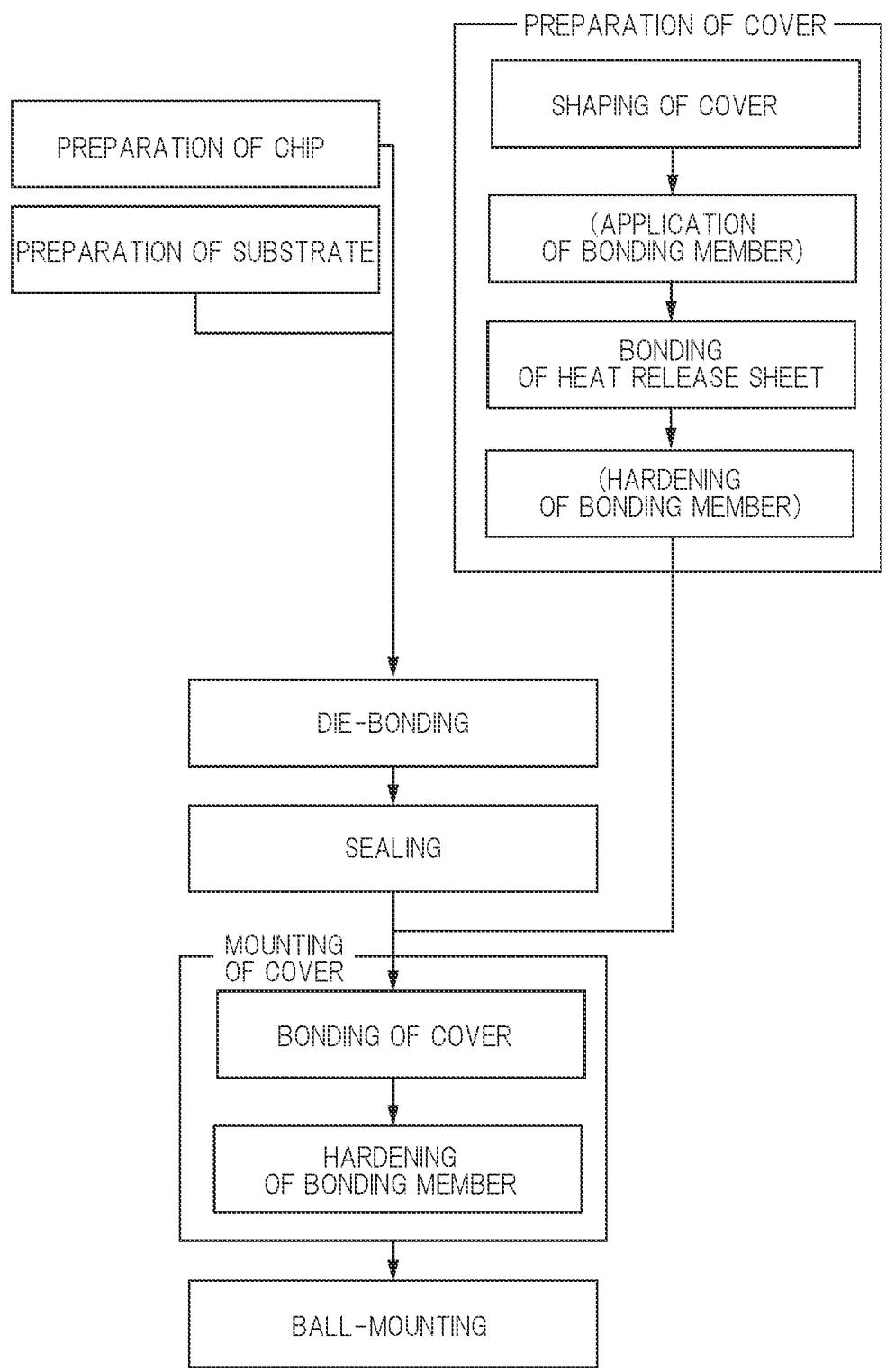
FIG. 15 is an explanatory diagram showing a flow of an assembly process of the semiconductor device explained with reference to FIGS. 1 to 4.

Next, the method of manufacturing the semiconductor device will be sequentially explained. The present section exemplifies the method of manufacturing the semiconductor device shown in FIG. 4 as a typical example of the semiconductor device for the explanation. For each of the modification examples, only differences from the typical example will be explained. FIG. 15 is an explanatory diagram showing a flow of an assembly process of the semiconductor device explained with reference to FIGS. 1 to 4.

Substrate Preparation Step

In a substrate preparation step shown in FIG. 15, the wiring substrate SUB1 shown in FIG. 4 is prepared. On the prepared wiring substrate SUB1 in the present step, each member of the wiring substrate SUB1 explained with reference to FIG. 4 is formed. However, as the wiring substrate SUB1, in the present step, a wiring substrate SUB1 that is provided before the mounting of the semiconductor chip CHP1, the heat release sheet TIM and the cover member LID is prepared.

Chip Preparation Step

In a chip preparation step shown in FIG. 15, the semiconductor chip CHP1 shown in FIGS. 3 and 4 is prepared. A structure of the semiconductor chip CHP1 is as described above, and therefore, repetitive explanation will be omitted.

Cover Preparation Step

In a cover preparation step shown in FIG. 15, the cover member LID that is previously bonded with the heat release sheet shown in FIG. 4 is prepared. Details of the preset step will be described later.

Die-Bonding Step

Next, in a die-bonding step shown in FIG. 15, the semiconductor chip CHP1 is mounted on the top surface 2t of the wiring substrate SUB1 as shown in FIG. 4. In the die-bonding step, the semiconductor chip CHP1 is mounted on the wiring substrate SUB1 so that the front surface 3t faces the top surface 2t of the wiring substrate SUB1 The plurality of electrodes 3PD of the semiconductor chip CHP1 are arranged at positions facing the plurality of terminals 2PD of the wiring substrate SUB1, respectively. After the semiconductor chip CHP1 is mounted on the wiring substrate SUB1, a reflow process is performed to electrically connect the plurality of electrodes 3PD and the plurality of terminals 2PD through the protrusion electrodes 3BP. Such a connection method is called flip-chip connection method, and the die-bonding method of the present embodiment is called face-down mounting method of arranging the front surface 3t of the semiconductor chip CHP1 and the top surface 2t of the wiring substrate SUB1 to face each other.

Sealing Step

Next, in a sealing step shown in FIG. 15, as shown in FIG. 4, the underfill resin UF is supplied into a gap between the semiconductor chip CHP1 and the wiring substrate SUB1 to seal the plurality of protrusion electrodes 3BP so that the protrusion electrodes are electrically insulated from one another.

Cover Mounting Step

Next, in a cover mounting step shown in FIG. 15, as shown in FIG. 4, the cover member LID is mounted on the top surface 2t of the wiring substrate SUB1. The cover mounting step includes a cover bonding step of bonding the cover member LID to the wiring substrate SUB1 through the bonding member BND1 and a bonding-member hardening step of hardening the bonding member BND1. In the present step, the cover member LID is bonded and fixed onto the top surface 2t of the wiring substrate SUB1 to cover the entire semiconductor chip CHP1, the entire heat release sheet TIM and a part of the wiring substrate SUB1 and to arrange the heat release sheet TIM to face the rear surface 3b of the semiconductor chip CHP1.

In the case of the method of manufacturing the semiconductor device PKG2 shown in FIG. 9, the electronic component EC1 is previously mounted at any timing between the substrate preparation step and the cover mounting step. In the present step, the cover member LID is arranged to entirely cover the semiconductor chip CHP1 and the electronic component EC1.

In the case of the method of manufacturing the semiconductor device PKG3 shown in FIG. 12, the semiconductor component CHP2 is previously mounted at any timing between the substrate preparation step and the cover mounting step. In the present step, the cover member LID is arranged to entirely cover the semiconductor chip CHP1 and the semiconductor component CHP2.

In the present step, the cover member LID is pressed so that the heat release sheet TIM is pressed onto the semiconductor chip CHP1. By adjustment of the pressuring force, the remaining gas between the semiconductor chip CHP1 and the heat release sheet TIM and between the heat release sheet TIM and the cover member LID can be discharged out, and the heat release sheet TIM can be made in contact with each of the semiconductor chip CHP1 and the cover member LID.

Ball Mounting Step

Next, in a ball mounting step shown in FIG. 15, the plurality of solder balls SB (see FIGS. 2 and 4) are bonded to the plurality of lands 2LD (see FIG. 4) that are formed on the bottom surface of the wiring substrate SUB1. In the present step, the solder ball SB is arranged on each of the plurality of lands 2LD that are exposed at the bottom surface of the wiring substrate SUB1, and then, is heated, and therefore, the plurality of solder balls SB and lands 2LD are bonded to each other. By the present step, the plurality of solder balls SB are electrically connected to the semiconductor chip CHP1 through the wiring substrate SUB1.

By each of the above-described steps, the semiconductor device PKG1 explained with reference to FIGS. 1 to 4 is provided. Then, necessary tests and experiments such as an appearance check test, an electric test and others are performed, and the semiconductor device PKG1 is shipped or mounted on a mounting board not illustrated.

Details of Cover Preparation Step

Next, details of the cover preparation step shown in FIG. 15 will be explained. As shown in FIG. 15, the cover preparation step includes a cover shaping step, a bonding-material applying step, a heat-release-sheet bonding step, and a bonding-member hardening step.

In the cover shaping step, the cover member LID is shaped as shown in, for example, FIGS. 4 and 5. The cover member LID is made of a metal, and can be easily shaped by, for example, press casting using a mold. As shown in FIG. 5, the shaped cover member HAS the portion LID1 facing the rear surface 3b of the semiconductor chip CHP1 in the cover mounting step, the flange portion LIDf arranged in the periphery of the portion LID1 and bonded and fixed to the top surface 2t (see FIG. 4) of the wiring substrate SUB1 (see FIG. 4) through the bonding member BND1, and the portion LID2 existing between the portion LID1 and the flange portion LIDf.

As explained with reference to FIGS. 5 to 8, 10 and 11, in the bonding method of arranging the bonding member BND2 between the cover member LID and the heat release sheet TIM, the bonding-member applying step as shown with parentheses in FIG. 15 is performed before the heat-release-sheet bonding step. In the bonding-member applying step, a pasted bonding member BND2 is prepared, and the bonding member BND2 is partially applied to at least either one of the cover member LID and the heat release sheet TIM. In the present embodiment, the bonding member BND2 does not need to have the high heat conductive property, and therefore, has a high degree of freedom for the option of the material making up the bonding member BND2. In a point of view of, for example, easiness in the application and the bonding strength, the suitable bonding member BND2 can be selected. For example, an epoxy resin not containing fillers can be used for the bonding member BND1 shown in FIG. 4 and the bonding member BND2 shown in FIG. 6. Alternatively, a resin bonding member containing fillers may be selected. Still alternatively, the bonding member BND1 and the bonding member BND2 may be made of a different material from each other.

As explained with reference to FIGS. 13 and 14, in the case of the bonding method of attaching the bonding member BND3 that is the tape member to the surface 4a of the heat release sheet TIM, the bonding-member applying step can be omitted.

The heat release sheet TIM that prepared in the heat-release-sheet bonding step has, for example, the surface 4a facing the semiconductor chip CHP1 in the cover mounting step and the surface 4b opposite to the surface 4a as shown in FIG. 6. Each area of the surface 4a and the surface 4b is larger than an area of the rear surface 3b of the semiconductor chip CHP1. As explained with reference to FIGS. 5 to 8, 10 and 11, in the bonding method of arranging the bonding member BND2 between the cover member LID and the heat release sheet TIM, the pasted bonding member BND2 is previously applied to at least either one of the cover member LID and the heat release sheet TIM in the bonding-member applying step, and therefore, the heat release sheet TIM can be bonded to the cover member LID by the pressing of the heat release sheet TIM onto the cover member LID after positional alignment between the cover member LID and the heat release sheet TIM. In the positional alignment between the cover member LID and the heat release sheet TIM, the positional alignment is performed so that the heat release sheet TIM covers the entire portion LID1 of the cover member. It is preferable to cover an entire circumference of a part of the portion LID2 by the heat release sheet TIM, the part being adjacent to the portion LID1. In the present step, the attachment of the cover member LID to the heat release sheet TIM is preferably performed to prevent the air bubbles from remaining. However, even if the air bubbles remain, the air bubbles can be discharged out by the cover bonding step of tie cover mounting step.

As explained with reference to FIGS. 13 and 14, in the case of the bonding method of attaching the bonding member BND3 that is the tape member to the surface 4a of the heat release sheet TIM, the positional alignment between the cover member LID and the heat release sheet TIM is performed in the heat-release-sheet bonding step. Details of the positional alignment are the same as those of the above-described method. After the positional alignment between the cover member LID and the heat release sheet TIM is completed, the bonding member BND3 that is the tape member is attached to the surface 4a (see FIG. 14) of the heat release sheet TIM. After the sticking layer BNA (see FIG. 14) is pasted on both the cover member LID and the heat release sheet TIM, the temporal fixation of the heat release sheet TIM is completed.

When the electrode ECe1 is exposed between the cover member LID and the wiring substrate SUB1 as seen in the semiconductor device PKG2 explained with reference to FIG. 9, it is preferable to, for example, bond the bonding member BND2 to each of the corners Tc1, Tc2, Tc3 and Tc4 as shown in FIG. 10 in the heat-release-sheet bonding step.

In the bonding-member hardening step, by the heating of, for example, the sticking layer BNA of the bonding member BND2 shown in FIG. 6 or the bonding member BND3 shown in FIG. 14, the heat hardening resin component contained in this member is hardened. In this manner, the heat release sheet TIM is bonded and fixed to the cover member LID. Since the heat release sheet TIM is temporarily fixed to the cover member LID by the heat-release-sheet bonding step of the cover preparation step, the bonding-member hardening step of the cover preparation step is omitted in some cases depending on the strength of the temporal fixation. In this case, by the bonding-member hardening step of the cover preparation step shown in FIG. 15, the bonding member BND1 shown in FIG. 4 and the bonding member BND2 shown in FIG. 6 (or the sticking layer BNA of the bonding member BND3 shown in FIG. 14) are collectively hardened. Since the bonding-member hardening step is omitted as described above, the work efficiency of the cover preparation step can be improved.

Modification Example of Bonding Portion of Cover Member

Figure 16:
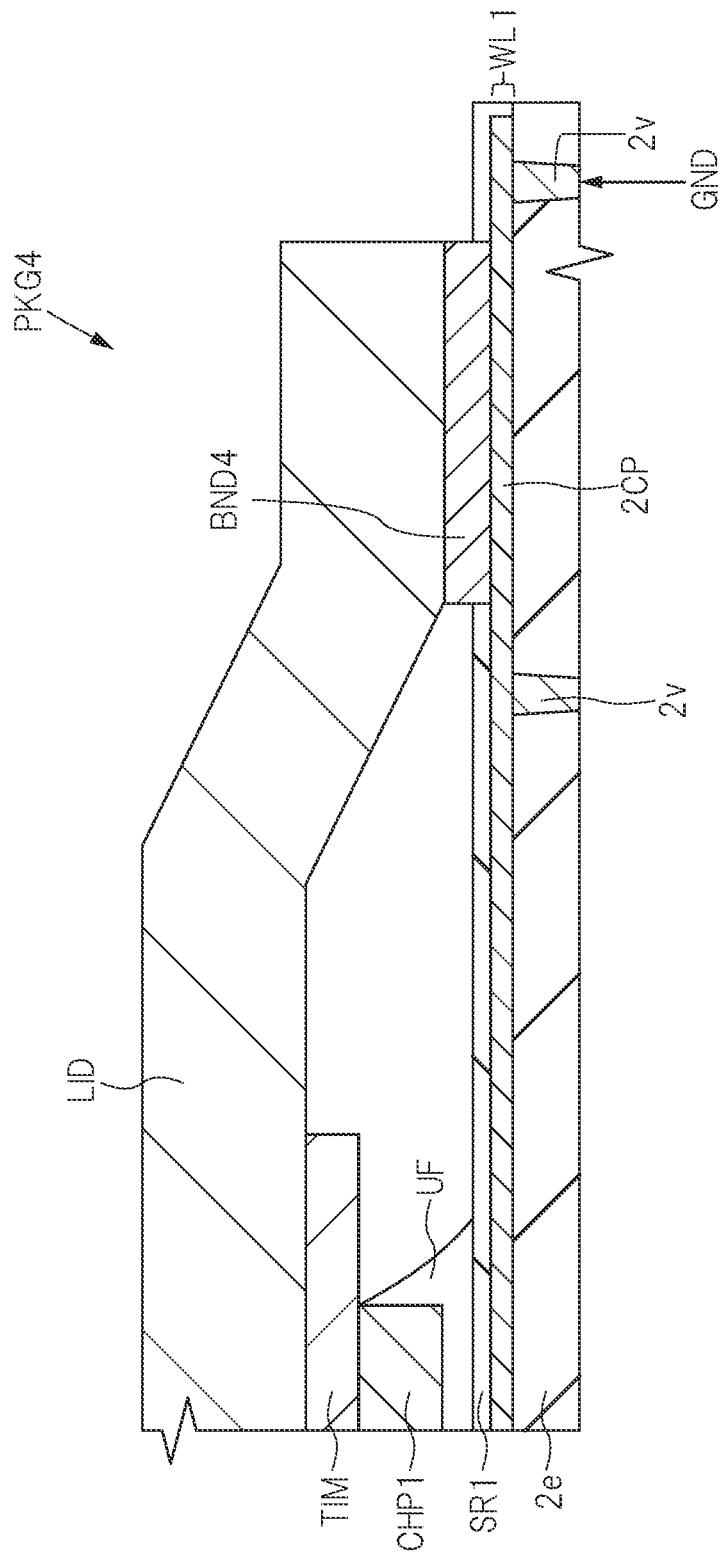
FIG. 16 is an enlarged plan view showing a modification example of a periphery of a bonding portion between the cover member and the wiring substrate shown in any of FIGS. 4, 9 and 12.

FIG. 16 is an enlarged plan view showing a modification example of a region of bonding between the cover member and the wiring substrate shown in any of FIGS. 4, 9 and 12.

A semiconductor device PKG4 shown in FIG. 16 is different from each of the semiconductor device PKG1 shown in FIG. 4, the semiconductor device PKG2 shown in FIG. 9 and the semiconductor device PKG3 shown in FIG. 12 in a structure of the portion connecting the cover member LID and the wiring substrate SUB1. In the semiconductor device PKG4, an opening is formed in a part of an insulating film SR1, and a part of a conductor pattern (grand plane) 2CP that is formed in the uppermost wiring layer WL1 of the wiring substrate SUB1 is exposed at the opening. The conductor pattern 2CP is a large-area conductor pattern to which a ground potential GND is supplied. Also, the semiconductor device PKG4 is different from each of the semiconductor device PKG1 shown in FIG. 4, the semiconductor device PKG2 shown in FIG. 9 and the semiconductor device PKG3 shown in FIG. 12 in that a bonding member BND4 is an electric-conductive bonding member having an electric conductivity. For example, the bonding member BND4 shown in FIG. 16 is made of a resin component such as an epoxy resin and a lot of electric-conductive particles such as silver particles) contained in the resin component.

In the semiconductor device PKG4, the ground potential GND is supplied to the cover member LID through the bonding member BND4 that is the electric-conductive bonding member. In this manner, the semiconductor chip CHP1 is covered with the cover member LID to which the ground potential GND is supplied. In this structure, since the cover member LID functions as a shield member for shielding electromagnetic noises between the semiconductor chip CHP1 and its peripheral space, the reliability of the electric operation of the semiconductor chip CHP1 can be improved.

In the foregoing, the present invention made by the present inventors has been concretely described on the basis of the embodiments. However, it is needless to say that the present invention is not limited to the foregoing embodiments, and various modifications can be made within the scope of the present invention.

What is claimed is:
1. A semiconductor device comprising:
a wiring substrate having a first surface;
a semiconductor chip having a second surface where a plurality of terminals is arranged and a third surface opposite to the second surface, and being mounted on the wiring substrate so that the second surface faces the first surface of the wiring substrate;
a heat release sheet arranged on the third surface of the semiconductor chip to cover the entire semiconductor chip and having a larger area than an area of the third surface of the semiconductor chip; and
a cover member which covers the entire semiconductor chip, the entire heat release sheet and a part of the wiring substrate and to which the heat release sheet is fixed,
wherein the cover member has a first portion facing the third surface of the semiconductor chip, a flange portion arranged in a periphery of the first portion and bonded and fixed onto the first surface of the wiring substrate through a first bonding member, and a second portion arranged between the first portion and the flange portion, and
wherein, in a plan view of the cover member viewed from the heat release sheet, the heat release sheet is bonded and fixed to the cover member through a second bonding member partially arranged between the heat release sheet and the cover member.
2. The semiconductor device according to claim 1,
wherein the heat release sheet is bonded and fixed to the cover member through the second bonding member arranged at a position overlapping the second portion of the cover member.
3. The semiconductor device according to claim 2,
wherein the second bonding member is not arranged at a position overlapping the first portion of the cover member.
4. The semiconductor device according to claim 1,
wherein the heat release sheet is bonded and fixed to the cover member through a plurality of the second bonding members that are spaced apart from one another.
5. The semiconductor device according to claim 1 further comprising:
an electronic component mounted on the wiring substrate and covered with the cover member,
wherein the electronic component includes an electrode exposed to a space surrounded by the cover member and the wiring substrate,
wherein, in a plan view, the heat release sheet has four sides and four corners at which two sides of the four sides cross each other, and
wherein the second bonding member is bonded to each of the four corners of the heat release sheet.
6. The semiconductor device according to claim 1 further comprising
a semiconductor component mounted on the wiring substrate and covered with the cover member, wherein the heat release sheet is arranged to cover each of the semiconductor chip and the semiconductor component.

7. A semiconductor device comprising:
a wiring substrate having a first surface;
a semiconductor chip having a second surface where a plurality of terminals are arranged and a third surface opposite to the second surface, and being mounted on the wiring substrate so that the second surface faces the first surface of the wiring substrate;
a heat release sheet arranged on the third surface of the semiconductor chip to cover the entire semiconductor chip and having a larger area than an area of the third surface of the semiconductor chip; and
a cover member which covers the entire semiconductor chip, the entire heat release sheet and a part of the wiring substrate and to which the heat release sheet is fixed,
wherein the cover member has a first portion facing the third surface of the semiconductor chip, a flange portion arranged in a periphery of the first portion and bonded and fixed onto the first surface of the wiring substrate through a first bonding member, and a second portion arranged between the first portion and the flange portion, and
wherein, in a plan view of the cover member viewed from the heat release sheet, the heat release sheet is bonded and fixed to the cover member through a second bonding member arranged at a position overlapping the second portion of the cover member.

8. The semiconductor device according to claim 7,
wherein the heat release sheet has a fourth surface facing the semiconductor chip and a fifth surface opposite to the fourth surface,
wherein the second bonding member is a tape member including a film layer and a sticking layer formed on either one surface of the film layer, and
wherein the sticking layer of the second bonding member is attached to the fourth surface of the heat release sheet and the cover member.

9. The semiconductor device according to claim 8,
wherein the heat release sheet is bonded and fixed to the cover member through a plurality of the second bonding members that are spaced apart from one another.

10. The semiconductor device according to claim 8 further comprising:
an electronic component mounted on the wiring substrate and covered with the cover member,
wherein the electronic component includes an electrode exposed to a space surrounded by the cover member and the wiring substrate,
wherein, in a plan view, the heat release sheet has four sides and four corners at which two sides of the four sides cross each other, and
wherein the second bonding member is bonded to each of the four corners of the heat release sheet.

11. A method of manufacturing a semiconductor device, the method comprising:
(a) preparing a wiring substrate having a first surface, a semiconductor chip having a second surface where a plurality of terminals are arranged and a third surface opposite to the second surface, and a cover member bonded to a heat release sheet, wherein, in a plan view of the cover member viewed from the heat release sheet, the heat release sheet is bonded and fixed to the cover member through a second bonding member arranged at a position overlapping the second portion;
(b) mounting the semiconductor chip on the first surface of the wiring substrate so that the second surface and the first surface face each other; and
(c) after (b), bonding and fixing the cover member onto the first surface of the wiring substrate to i) cover the entire semiconductor chip, the entire heat release sheet and a part of the wiring substrate and ii) cause the heat release sheet and the third surface of the semiconductor chip to face each other,
wherein the cover member has a first portion, a flange portion, and a second portion,
wherein the cover member is bonded and fixed onto the first surface of the wiring substrate so that the first portion of the cover member faces the third surface of the semiconductor chip, the flange portion is arranged in a periphery of the first portion and bonded and fixed onto the first surface of the wiring substrate through a first bonding member, and the second portion is arranged between the first portion and the flange portion,
wherein the heat release sheet has a fourth surface facing the semiconductor chip and a fifth surface opposite to the fourth surface,
wherein an area of the fourth surface of the heat release sheet is larger than an area of the third surface of the semiconductor chip.

* * * * *